United States Patent
Kwan

(10) Patent No.: US 8,065,103 B2
(45) Date of Patent: Nov. 22, 2011

(54) CALIBRATION OF A POSITION MEASURING DEVICE OF AN OPTICAL DEVICE

(75) Inventor: Yim-Bun Patrick Kwan, Aalen (DE)

(73) Assignee: Carl Ziess SMT GmbH, Oberkochen (DE)

( * ) Notice: Subject to any disclaimer, the term of this patent is extended or adjusted under 35 U.S.C. 154(b) by 8 days.

(21) Appl. No.: 12/731,564

(22) Filed: Mar. 25, 2010

(65) Prior Publication Data

US 2010/0235127 A1 Sep. 16, 2010

Related U.S. Application Data

(63) Continuation of application No. PCT/EP2008/062787, filed on Sep. 24, 2008.

(30) Foreign Application Priority Data

Sep. 28, 2007 (DE) .................. 10 2007 046 927

(51) Int. Cl.
- *G06F 19/00* (2011.01)
- *G01B 11/14* (2006.01)
- *G03B 27/42* (2006.01)

(52) U.S. Cl. .......................... 702/94; 356/614; 355/53

(58) Field of Classification Search ............... 702/94, 702/85; 356/614, 620; 355/53, 77
See application file for complete search history.

(56) References Cited

U.S. PATENT DOCUMENTS

| | | | |
|---|---|---|---|
| 5,798,947 A | 8/1998 | Ye et al. | |
| 6,757,059 B2 | 6/2004 | Ebert et al. | |
| 7,160,657 B2 | 1/2007 | Smith et al. | |
| 7,528,965 B2 * | 5/2009 | Loopstra et al. | 356/614 |
| 7,561,270 B2 * | 7/2009 | Kwan | 356/400 |
| 2006/0227309 A1 * | 10/2006 | Loopstra et al. | 355/53 |
| 2007/0222965 A1 | 9/2007 | Koenen | |

FOREIGN PATENT DOCUMENTS

| | | |
|---|---|---|
| DE | 10 2005 062618 | 7/2007 |
| EP | 1 182 509 | 2/2002 |
| WO | WO 2009/014252 | 1/2009 |

OTHER PUBLICATIONS

International Preliminary Report on Patentability for the corresponding PCT Application No. PCT/EP2008/062787, dated Jun. 1, 2010.
"Optra NanoGrid Planar Encoder" www.OPTRA.com/UsingNanoGridrs, OPTRA, Inc., Topsfield MA, US, dated Sep. 21, 2007.

* cited by examiner

*Primary Examiner* — Bryan Bui
(74) *Attorney, Agent, or Firm* — Fish & Richardson P.C.

(57) ABSTRACT

A method for calibrating a position measuring device of an optical device, including a measurement step in which a movable unit of the optical device is moved according to a predefinable scheme in at least one degree of freedom and a position of the movable unit is determined in the at least one degree of freedom. The position of the movable unit is determined in the at least one degree of freedom in a first measurement via a first measuring device of the position measuring device, and the position of the movable unit is determined in the at least one degree of freedom in a second measurement via a second measuring device of the position measuring device sing a reference element connected to the movable unit. In a calibration step, the first measuring device is calibrated using the results of the first measurement and the second measurement. An encoder system is used as the second measuring device. The reference element includes a reference grid of the encoder system.

20 Claims, 2 Drawing Sheets

US 8,065,103 B2

CALIBRATION OF A POSITION MEASURING DEVICE OF AN OPTICAL DEVICE

CROSS-REFERENCE TO RELATED APPLICATIONS

This application is a continuation of, and claims benefit under 35 USC 120 to, international application PCT/EP2008/062787, filed Sep. 24, 2008, which claims benefit of German Application No. 10 2007 046 927.8, filed Sep. 28, 2007. International application PCT/EP2008/062787 is hereby incorporated by reference in its entirety.

FIELD

The present disclosure relates to a method for calibrating a position measuring device of an optical device. The invention can be used, in particular, in microlithography used in the production of microelectronic circuits, such as with respect to inspection of components, which are used in the production of microelectronic circuits of this type (for example to inspect optical masks) or in conjunction with the result of intermediate products or end products of microlithography (for example the inspection of exposed substrates). The present disclosure therefore also relates to an optical device with a corresponding position measuring device.

BACKGROUND

In particular in the area of microlithography, apart from the use of components configured with a precision that is as high as possible, it is among other things desirable to position the components of the imaging device, in other words, for example, the optical elements (lenses, mirrors, etc.), the mask with the pattern to be imaged and the substrate to be exposed, as precisely as possible in relation to one another to achieve a correspondingly high imaging quality. The desired high precision properties, which are in the microscopic range in the order of magnitude of a few nanometers or below, are not least a consequence of the constant desire to increase the resolution of the optical systems used in the production of microelectronic circuits in order to advance the miniaturisation of the microelectronic circuits to be produced.

With the increased resolution and the reduction in the wavelength of the light used generally accompanying this, not only the demands on the positioning precision of the components used increase but the desired properties with regard to minimisation of the imaging errors of the overall optical arrangement are, of course, also increased.

In order to adhere to the high desired properties of the positioning of the components involved at the low operating wavelengths in the UV range used in microlithography, for example with operating wavelengths in the region of 193 nm, but in particular also in the so-called extreme UV range (EUV) with operating wavelengths in the region of 13 nm, it is frequently proposed that the position of the individual components, such as the mask table, the optical elements and the substrate table (for example a table for the so-called wafer) be determined, in each case individually with respect to a reference—for example a reference structure (that is stabilised with respect to its position, orientation and geometry against dynamic and thermal influences)—and that these components be then actively positioned with respect to one another.

Several problems occur here. On the one hand, it is generally desirable to achieve a positioning precision and therefore also a measuring precision of the measuring system used in the sub-nanometer range in up to six degrees of freedom. Likewise, the measuring system used has to be regularly calibrated to prevent the appearance of drifts, such as can occur during operation of an optical device of this type (for example due to thermal influences or the like). Consequently, it is desirable to achieve, eventually over several minutes through to several hours, high stability of the position of the components of the measuring system or to carry out a calibration correspondingly frequently. Finally, it is desirable to eliminate systematic errors of the measuring system (which are caused, for example, by a deviation of the components of the measuring system from their desired state).

If, for example, the position of a movable unit (such as the substrate table of a microlithography device or the like) is determined via an interferometry system, which is equipped with planar mirrors, as a position measuring device, planarity deviations of the planar mirrors (generally in the region of about 10 nm) have a direct effect on the measuring precision and therefore the positioning precision of the movable unit. In order to reduce systematic errors of this type (typically by a factor of 20), a calibration of the position measuring device generally takes place, as is known, for example, from EP 1 182 509 A2 (Kwan), the disclosure of which is incorporated herein by reference. A calibration of this type generally is repeated regularly at least over the time period during which the appearance of drifts (in other words, for example, thermally caused changes in the relative position of the components involved in the measurement) can occur.

Two different approaches are generally followed during a regular calibration of this type. On the one hand, it is known to equip the position measuring device with a corresponding redundancy, in other words to provide more than one measuring device for the respective degrees of freedom, in which a position measurement has to take place in order to identify and eliminate systematic errors via the redundant position information to be obtained in this way. However, this has the drawback that the outlay for the position measuring device can increase substantially as a high number of complex and relatively expensive highly precise measuring devices is involved.

A further approach involves the use of a so-called secondary reference element, which is permanently or temporarily connected to the movable unit, the position of which is to be measured during operation, as is known, for example, from U.S. Pat. No. 6,757,059 B2 (Ebert et al.) or U.S. Pat. No. 7,160,657 B2 (Smith et al.), the disclosures of each of which are incorporated herein by reference. To calibrate the position measuring device, the position of the movable unit is, on the one hand, determined by the first measuring device used during operation and, in parallel with this, by a second measuring device using the reference element. The reference element located in a precisely predefined position and orientation with respect to the movable unit in this case generally has an adequate number of reference marks (with a precisely defined position on the reference element), which are determined via the second measuring device (for example via a CCD camera) in order to determine the position and/or orientation of the movable unit via a corresponding processing of the measurement data of the second measuring device, as is known from U.S. Pat. No. 7,160,657 B2.

SUMMARY

In some embodiments, the disclosure provides a method for calibrating its position measuring device of an optical device and a corresponding optical device, which can, in an easy manner, and as far as possible in real time, allow rapid and reliable calibration of the position measuring device.

The present disclosure is based on the realization that a rapid and reliable calibration of the position measuring device, eventually even in real time as in normal operation, can be achieved if an encoder system is used as the second measuring device, the reference element including a reference grid of the encoder system. The use of an encoder system for the measuring device, on the one hand, has the advantage that an encoder system of this type generally has a correspondingly high processing rate, so the reference measurement used for calibration can take place via the encoder system in real time even at the optionally very high speeds that the movable unit reaches during normal operation of the optical device. Finally, the speed of the reference measurement is only limited by the limits of the components used for the measurement and the data collection.

As a result, substantially shorter interruptions of the normal operation of the optical device for the calibration can be achieved, so that, on the one hand, with time intervals remaining the same between the calibrations, a higher throughput or a higher productivity of the optical device can be achieved. On the other hand, the time intervals between the calibrations may be reduced and thus errors of the optical device caused by drift effects can be reduced and therefore the precision of the optical device can be increased.

In addition, compared to certain known methods, a substantially higher number of measuring points can be determined via an encoder system of this type and therefore a higher resolution of the position determination can be achieved in the course of the reference measurement, so the precision of the calibration can be substantially increased in a simple manner.

Highly precise one-dimensional and multi-dimensional encoder systems with a resolution in the sub-nanometer range are available, so even demanding calibration tasks are possible in conjunction with the components used in microlithography. The encoder systems operated under the name "Optra NanoGrid Planar Encoder" from the company OPTRA, Inc., Topsfield Mass. 01983, US, which achieve a resolution of less than 0.5 nm, are an example of a (two-dimensional) encoder system of this type.

A further advantage of encoder systems of this type is that the reference grid (for example via an exposure process) can be applied to a corresponding thermally stable substrate (for example a substrate with a very low thermal coefficient of expansion, such as, for example Zerodur, ULE etc.). It is possible, in particular in conjunction with the masks used in the area of microlithography and substrates to be exposed (for example wafers), to implement the reference element with the same dimensions as the relevant mask or the relevant substrate and to simply fasten the reference element for the calibration in place of the former on the associated mask table or substrate. This has the advantage that the reference measurement takes place at least close to the region of interest during normal operation, for the positioning of which the measurements of the position measuring device to be calibrated are used during normal operation.

In some embodiments, the present disclosure provides a method for calibrating a position measuring device of an optical device, in which, in a measurement step, a movable unit of the optical device is moved according to a predefinable scheme in at least one degree of freedom and a position of the movable unit is determined in the at least one degree of freedom. The position of the movable unit is determined in the at least one degree of freedom in a first measurement via a first measuring device of the position measuring device. Furthermore, the position of the movable unit is determined in the at least one degree of freedom in a second measurement via a second measuring device of the position measuring device using a reference element connected to the movable unit. Finally, in a calibration step, the first measuring device is calibrated using the results of the first measurement and the second measurement. In this case, an encoder system is used as the second measuring device, wherein the reference element includes a reference grid of the encoder system.

In certain embodiments, the present disclosure provides an optical device, in particular for microlithography, with a movable unit which can be moved by a drive unit, a control device and a position measuring device, wherein the position measuring device includes a first measuring device and a second measuring device. The position measuring device is configured to determine, in a measurement step, a position of the movable unit moved by the drive unit according to a predefinable scheme in at least one degree of freedom. The first measuring device is configured to determine, in a first measurement, a first variable which is representative of the position of the movable unit in the at least one degree of freedom and to pass it to the control device, while the second measuring device includes a reference element connected to the movable unit and is configured to determine, in a second measurement, using the reference element, a second variable which is representative of the position of the movable unit in the at least one degree of freedom and to pass it to the control device. The control device is configured to calibrate, in a calibration step, the first measuring device using the results of the first measurement and the second measurement. The second measuring device includes an encoder system, wherein the reference element includes a reference grid of the encoder system.

Further configurations of the disclosure will become apparent from the dependent claims or the description of exemplary embodiments given below, which refers to the accompanying drawings.

DETAILED DESCRIPTION OF THE DISCLOSURE

Figure 1:
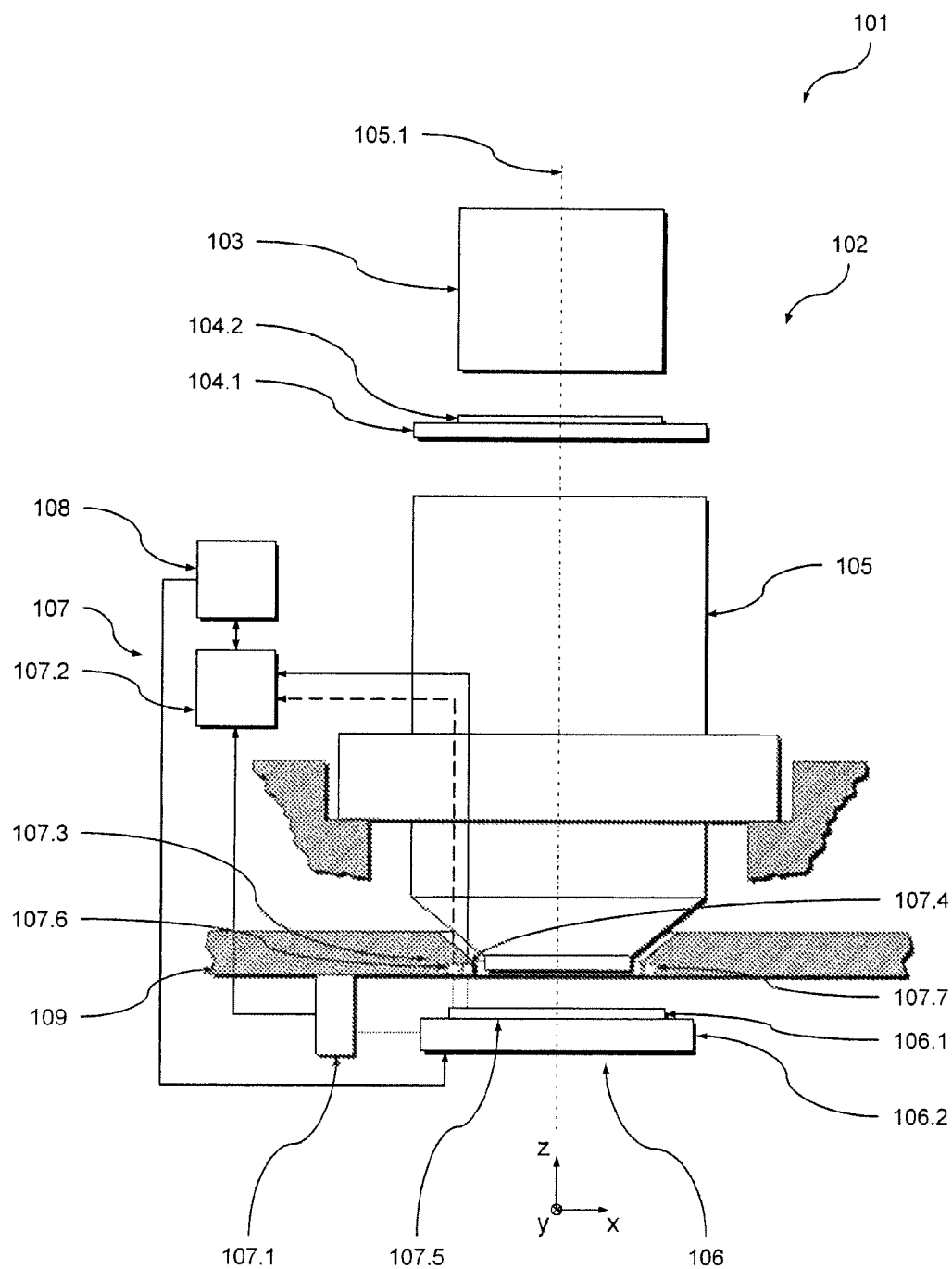
FIG. 1 is a schematic view of an exemplary embodiment of the optical device according to the disclosure.
Figure 2:
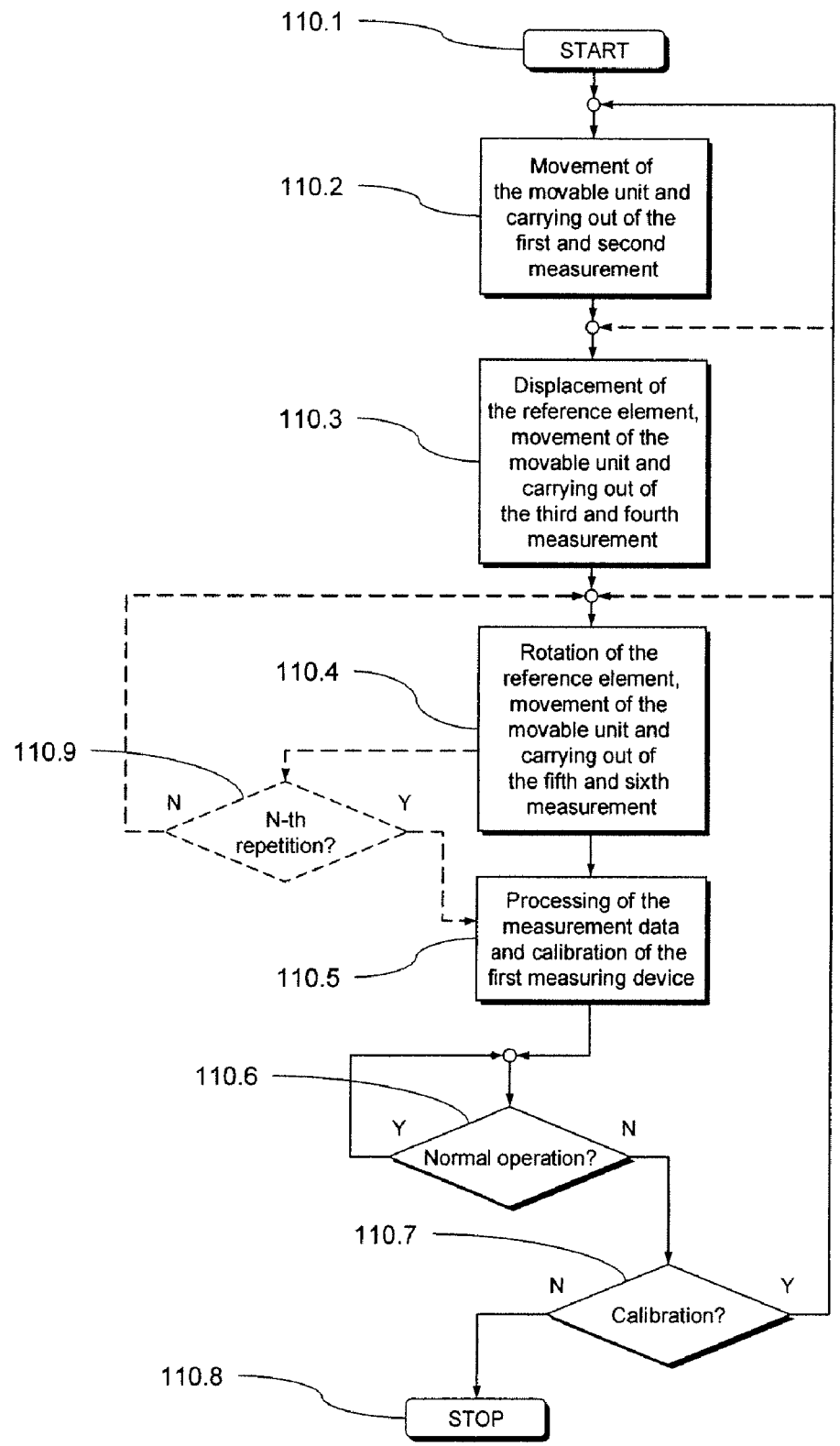
FIG. 2 is a flow chart of an imaging method with an exemplary embodiment of the method according to the disclosure for calibrating a position measuring device, which can be carried out with the optical device of FIG. 1.

With reference to FIGS. 1 and 2, an exemplary embodiment of the optical device according to the disclosure is described below in the form of an imaging device 101 for microlithography, with which an exemplary embodiment of the method for calibrating a position measuring device according to the disclosure can be carried out.

FIG. 1 shows a schematic view of an exemplary embodiment of the optical device according to the disclosure in the form of a microlithography device 101, which works with light in a predefined operating wavelength of 193 nm. However, it will be understood that, in other variants of the disclosure, other wavelengths may also be used. In particular, the operating wavelength may be in the extreme UV range (EUV) in the range between 5 nm and 20 nm, typically 13 nm.

The microlithography device 101 includes an optical projection system 102 with an illumination system 103, a mask device and a projection device in the form of an objective 105 with an optical axis 105.1. During normal operation of the microlithography device 101, the illumination system 103 illuminates, via a corresponding light guide system (not shown), a mask 104.1 of the mask device with a projection light beam (not shown in more detail). Located on the mask 104.1, which is arranged on the mask table 104.2, is a projection pattern, which is projected with the projection light beam via the optical elements arranged in the objective 105 onto a substrate 106.1, for example a so-called wafer, which is arranged on a movable unit in the form of a movable substrate table 106.2 of a substrate device 106.

The objective 105, for this purpose, includes a series of optical elements (not shown in more detail), which are mounted in the housing of the objective 105. Depending on the operating wavelength used, the optical elements may be any optical elements (lenses, mirrors, grids etc.).

During normal operation of the microlithography device 101, its individual components involved in the imaging have to be brought into a precisely defined position and alignment with respect to one another in order to achieve an imaging result of adequate quality. In this case, among other things (in accordance with the respective working principle of the microlithography device 101), the substrate table 106.2 with the substrate 106.1 located thereon (in a precisely defined position and orientation) is positioned in up to six degrees of freedom.

For this purpose, a first variable which is representative of the position of the substrate table 106.2 and therefore of the substrate 106.1 in the respective degree of freedom is determined via a first measuring device 107.1 of a position measuring device 107 and passed to a processing unit 107.2 connected therewith of the position measuring device 107. The processing unit 107.2 eventually processes the signals of the first measuring device 107.1 and supplies corresponding signals to a control device 108. The control device 108, in a known manner, determines a deviation of the current position of the substrate table 106.2 determined via the position measuring device 107 from a setpoint position of the substrate table 106.2 and activates the drive unit of the substrate table 106.2 accordingly to counteract this deviation and thus to bring the substrate 106.1 in the desired degrees of freedom into its desired position.

The first measuring device 107.1, in the present example, includes a well known interferometry system, with which changes in the relative position between the measuring device 107.1 fastened to a (optionally thermally stabilised) support structure 109 and the substrate table 106.2 can be determined. In order to be able to determine the absolute position of the substrate table 106.2 with regard to the measuring device 107.1, the measuring device 107.1 includes, in a well known manner, one or more further position sensors, with which an initial starting position of the substrate table 106.2 with respect to the measuring device 107.1 can be determined (for example mechanical stops or contactlessly working sensors, such as capacitive sensors etc.).

However, the first measuring device, in other variants of the disclosure, may also include any other devices to determine the position between the measuring device and the substrate table. In particular, encoder systems may also be used here.

In the first measuring device 107.1, the problem exists that, for example due to thermally caused expansion of the components of the microlithography device 101, changes are produced in the relative position of the components of the first measuring device bringing about drift effects in the measuring results of the first measuring device 107.1. These drift effects in turn cause an error in the positioning of the substrate table 106.2 and therefore an imaging error in the exposure of the substrate 106.1.

In order to keep drift effects of this type as low as possible, during operation of the microlithography device 101, a calibration of the position measuring device 107 is carried out at predefinable intervals. For this purpose, the position measuring device 107 has a second measuring device in the form of an encoder system 107.3. The encoder system 107.3 includes a first measuring unit in the form of a first reading head 107.4 and an associated reference element 107.5 with a two-dimensional reference grid.

The first reading head 107.4 is fastened to the support structure 109, while the reference element 107.5 is seated on the substrate table 106.2. The reference element 107.5 is an element made of a thermally highly stable glass material with a thermal coefficient of expansion close to zero (such as, for example, Zerodur, ULE Glass etc.). In addition or as an alternative, the reference element may be thermally stabilised (hence, kept at a predefinable temperature) via a corresponding thermal stabilisation device (for example an active or passive temperature control device etc.).

The reference grid is applied to this reference element 107.5, for example via an exposure process. The reference element 107.5 has the dimensions of a substrate 106.1 to be exposed during normal operation and is fastened during calibration in its place in a precisely defined position and orientation on the substrate table 106.2.

The encoder systems marketed under the name "Optra NanoGrid Planar Encoder" from the company OPTRA, Inc., Topsfield Mass. 01983, US, which achieve a resolution of less than 0.5 nm (more precisely a resolution of 0.305 nm) with regard to the position measurement, are an example of a two-dimensional encoder system 107.3 of this type. However, it is to be understood that, in other variants of the disclosure, other suitable encoder systems can also be used. In particular, depending on the number of relevant degrees of freedom with regard to the calibration, one or more one-dimensional encoder systems can also be used individually or in combination with one or more two-dimensional encoder systems.

The position of the substrate table 106.2 in two translatory degrees of freedom (x-direction and y-direction) can be determined via the encoder system 107.3 in the present example. However, it is to be understood that in other variants of the disclosure, a plurality of encoder systems of this type may also be provided to determine the position or the orientation of the substrate table in up to six degrees of freedom.

The operation of the microlithography device 101 and the method according to the disclosure for calibrating the position measuring device 107 will be described below with reference to FIGS. 1 and 2. First, in a step 110.1, the operation of the microlithography device 101 is started.

In a first measurement step 110.2, the reference element 107.5 is first fastened to the substrate table 106.2 in a predefined position and orientation. The substrate table 106.2 with the reference element 107.5 is then moved, controlled by the control device 108, according to a predefined scheme in the two aforementioned degrees of freedom (x, y). For this purpose, a precisely defined starting position is first approached, in which the substrate table has a precisely defined relative position to the support structure 109. The reaching of this starting position can be determined via the additional absolute position sensors of the first measuring device 107.1 mentioned above. The reaching of the starting position can, however, be determined via the second measuring device 107.3. For this purpose, the reference element 107.5 has one or more corresponding reference marks, which are determined via the first reading head 107.4.

If it was determined that the starting position has been reached, the substrate table is moved according to the predefined scheme and, in a first measurement, the position of the substrate table 105.2 is determined in the two above-mentioned degrees of freedom (x, y) via the first measuring device 107.1. At the same time, via the encoder system 107.3, in a second measurement, the position of the reference element 107.5 and therefore also the position of the substrate table 105.2 are determined in the two above-mentioned degrees of freedom (x, y). The first measuring device 107.1 and the encoder system 107.3 in each case synchronously determine here a variable representative of the corresponding position and supply corresponding signals to the processing unit 107.2.

According to the predefinable scheme, optionally, the useful region of the substrate table 106.2 is moved through, in other words the entire movement region of the substrate table 106.2 through which movement region the latter also moves during normal operation during exposure of the substrate 106.1. Owing to the use of the encoder system 107.3, this can take place in real time, therefore at the speeds which the substrate table 106.2 reaches during normal operation during exposure of the substrate 106.1. This process is only limited by the processing speed of the components, which are involved in the data collection, of the position measuring device 107. The data thus collected and optionally suitably processed (immediately or at a later instant) are passed as the result of the first and second measurement to the control device 108.

In a second measurement step 110.3, the reference element 107.5 is firstly displaced in the plane of the two degrees of freedom (x, y) by a defined amount transversely to one of the two degrees of freedom by a manipulation device (not shown in more detail). The amount of the displacement can, in this case, be monitored by the encoder system 107.3. The substrate table is then moved again according to the predefined scheme and, in a third measurement, the position of the substrate table 105.2 is determined in the above-mentioned degrees of freedom (x, y) via the first measuring device 107.1. At the same time, the position of the reference element 107.5 and therefore the substrate table 105.2 is determined in the two degrees of freedom (x, y) via the encoder system 107.3 in a fourth measurement. The first measuring device 107.1 and the encoder system 107.3 in turn in each case determine here a variable representative of the corresponding position and supply corresponding signals to the processing unit 107.2. The data thus collected and eventually suitably processed (immediately or at a later instant) are passed as a result of the third and fourth measurement to the control device 108.

In a third measurement step 110.4, the reference element 107.5 is first rotated by a manipulation device (not shown in more detail) in the plane of the two degrees of freedom (x, y) through a defined angle, such as 90°. The amount of the rotation may be monitored here by a suitable sensor device. The substrate table 106.2 is then moved again according to the predefined scheme and, in a fifth measurement via the first measuring device 107.1, the position of the substrate table 105.2 is determined in the two above-mentioned degrees of freedom (x, y). Simultaneously, via the encoder system 107.3 in a sixth measurement, the position of the reference element 107.5 and therefore the substrate table 105.2 is determined in the two degrees of freedom (x, y). The first measuring device 107.1 and the encoder system 107.3 in each case here in turn determine a variable representative of the corresponding position and supply corresponding signals to the processing unit 107.2. The data thus collected and eventually suitably processed are (immediately or at a later instant) passed as the result of the fifth and sixth measurement to the control device 108.

The displacement of the reference grid in the second measuring step 110.3 and the rotation of the reference grid in the third measurement step 110.4 are used to determine systematic errors of the encoder system 107.3, for example distortions and orthogonality errors of the reference grid etc. (which, for example, are inherent to the reference grid or originate from a deformation of the reference grid when it is fastened to the substrate table), and to be able to take them into account accordingly during calibration.

However, it is to be understood that in other variants of the disclosure, such a displacement and/or rotation of the reference element is only possible, if at all, with an increased expense. In this case, it may be provided that the second measuring device 107.3 includes a second reading head, as indicated in FIG. 1 by the dashed contour 107.6. Instead of the displacement of the reference element, it may then be provided that, in the second measurement step, the fourth measurement does not take place via the first reading head 107.4 but via the second reading head 107.6.

The second reading head 107.6 is arranged in a precisely defined position with respect to the first reading head 107.4. It is provided here that the two reading heads 107.4 and 107.6 can be arranged in a common thermally stable mounting or one that is thermally stabilised by a suitable device in order to keep the relative position of the two reading heads 107.4 and 107.6 stable. The mounting is made here from a thermally stable material with a thermal coefficient of expansion close to zero (such as, for example, Zerodur, ULE Glass etc.) in order to ensure this in a simple manner.

It is furthermore to be understood that the rotation of the reference element 107.5 does not necessarily have to take place after the displacement of the reference element 107.5. Rather, conversely, the measurement may also take place on the rotated reference element first followed by the measurement on the laterally displaced reference element. Furthermore, it is to be understood that the second or third measurement step may not necessarily take place. Rather, one of these two measurement steps may also be omitted.

In a calibration step 110.5, the control device 108, on the one hand, then determines from the results of the second, fourth and sixth measurement, systematic errors of the encoder system and stores these in a corresponding correction dataset. Furthermore, the deviations of the measurements of the first measuring device 107.1 from the measurements of the encoder system 107.3 are determined from the results of the first to sixth measurement (using the correction dataset) and calibration values for the first measuring device 107.1 are determined in a known manner from this and are stored in a calibration dataset and used to calibrate the measuring device 107.1.

In a step 110.6, it is then checked whether the normal operation of the microlithography device 101 is to be carried out. If this is the case, the normal operation is taken up and carried out until it is determined in the step 110.6 continuously repeated parallel to this that normal operation should be interrupted.

If this is the case, a check is made in a step 110.7 whether a further calibration should be carried out. If this is not the case, the method sequence is ended at a step 110.8. Otherwise, there is a jump back to the step 110.2. However, it is to be understood that in other variants of the disclosure, it can also be provided that not all three measurement steps 110.2 to 110.4 are repeated for the renewed calibration. Rather, it may be provided that two or even only one of the measurement steps 110.2 to 110.4 are repeated (with the reference element 107.5 then again fastened to the substrate table 106.2). Optionally, a jump back can thus also be made only to the step 110.3 (repetition of the second measurement step 110.3 and the third measurement step 110.4), the displacement of the reference element 107.5 also then optionally not being necessary. Likewise, a jump back can also be made only to the step 110.4 (repetition of the third measurement step 110.4), the rotation of the reference element 107.5 then also optionally not being necessary.

A repetition of a part of the measurement steps can be selected when the systematic errors of the encoder system 107.3 from the correction dataset or calibration dataset determined from a proceeding calibration are used for the calibration in the renewed calibration step 110.5 and no significant change in the systematic error is to be expected by renewed fastening of the reference element 107.5 to the substrate table 106.2.

Furthermore, it is possible in other variants of the disclosure that in the first calibration and/or in (individual or all) subsequent calibrations, the third measurement step 110.4 is repeated N-times to increase the precision. The number N of repetitions can be arbitrarily specified.

For this purpose, a check can be made after the measurement step 110.4 in a checking step 110.9, and the N-th repetition has been reached. If this is the case, a transfer is made to the calibration step 110.5. Otherwise, a jump is made back to the third measurement step 110.4, a renewed rotation of the reference element 107.5 then taking place. As a result it is possible, for example, to carry out measurements with the reference element 107.5 in a plurality of rotational positions (for example 0°, 90°, 180°, 270°).

As was already explained above, the position of the substrate table 106.2 can be determined via the encoder system 107.3, in the present example, in two translatory degrees of freedom (x-direction and y-direction). As mentioned, in other variants of the disclosure, a plurality of encoder systems of this type may also be provided to determine the position or orientation of the substrate table in up to six degrees of freedom. It is obvious here that these encoder systems can divide the reference element 107.5. In particular, a parallel measurement can be carried out in one or more of the measurement steps 110.2 to 110.4 (using the reference element 107.5), for example via a third reading head 107.7 arranged opposing the first reading head 107.4 (with respect to the objective 105) in order to increase the precision of the later calibration. A further advantage of this solution is that a measurement is possible over the entire movement region of the substrate table 106.2.

Owing to the rapid data determination possible with the method according to the disclosure in real time, a clear reduction of the calibration period can be achieved compared to the known calibration methods. In the calibration method according to the disclosure just described, a reduction to a calibration period in the order of magnitude of 5 minutes is possible. By repeating only a part of the measurement steps in a subsequent calibration, the calibration period can be still further reduced. Accordingly, the calibration can be carried out at shorter intervals in order to increase the precision of the microlithography device 101, or (with adequate stability of the microlithography device 101 between the calibrations), with the intervals remaining the same between the calibrations, the throughput and therefore the productivity of the microlithography device 101 can be increased.

A further advantage of the present disclosure is that the second measuring device 107.3 is arranged so close to the useful region of the substrate table 106.2 that the measurement region of the second measuring device 107.3 substantially overlaps with the useful region of the substrate table 106.2. As a result, it is advantageously possible to use a region for calibration, close to the working region of interest of the substrate table 106.2, the exact positioning of which is to take place during normal operation of the microlithography device 101 via the measurements of the first measuring device 107.1 to be calibrated.

Therefore, the reference measurement takes place at least close to the region of interest during normal operation, for the positioning of which the measurements of the position measuring device to be calibrated are used during normal operation. However, it is to be understood that in other variants of the disclosure, it may also be provided that the reference element is arranged at a different point of the substrate table, so the measuring region of the encoder system and the region of interest (to be positioned via the measurements of the first measuring device to be calibrated) in normal operation only overlap or optionally even have no contact at all.

The present disclosure was described above via examples, in which the movable element of the optical device is a substrate table of a microlithography device. However, it is to be understood that the disclosure can just as well be used in conjunction with other movable components of the microlithography device (for example the also movable mask table of the microlithography device) as in conjunction with other optical devices. In particular it is possible, for example, to use the disclosure in conjunction with the inspection of masks and/or exposed substrates (such as wafers, etc.), as the movable components, which carry the masks or substrates to be inspected, are also to be positioned here with correspondingly high precision.

It is furthermore to be noted that the present disclosure was described above using an example from the area of microlithography. However, it is to be understood that the present disclosure can just as well be used for any other applications or imaging methods.

What is claimed is:

1. A method of calibrating a position measuring device, the method comprising:
    moving a movable unit of an optical device according to a first predefinable scheme in at least one degree of freedom;
    in a first measurement step, determining a first position of the movable unit in the at least one degree of freedom in first and second measurements, the first measurement being performed via a first measuring device of the position measuring device, and the second measurement being performed via a second measuring device of the position measuring device using a reference element connected to the movable unit; and
    in a first calibration step, calibrating the first measuring device based on results of the first and second measurements,
    wherein the second measuring device comprises an encoder system, and the reference element comprises a reference grid of the encoder system.

2. The method according to claim 1, wherein:
    the encoder system comprises a two-dimensional encoder system;
    the grid comprises a two-dimensional grid; and/or
    the encoder system has a resolution below one nanometer.

3. The method according to claim 1, wherein the reference element has a low thermal coefficient, and/or the reference element is thermally stabilised via a thermal stabilisation device.

4. The method according to claim 1, further comprising, in a second measurement step:
- moving the movable unit according to a second predefinable scheme in the at least one degree of freedom; and
- determining a second position of the movable unit in the at least one degree of freedom in third and fourth measurements, the third measurement being performed via the first measuring device, and the fourth measurement being performed via the second measuring device using the reference element,
- wherein the first calibration step comprises calibrating the first measuring device based on results of the first, second, third and fourth measurements.

5. The method according to claim 4, wherein the movable unit is moved in the second measurement step according to the same scheme as in the first measurement step.

6. The method according to claim 4, wherein:
- in the first measurement step, the reference element has a first position and a first orientation with respect to the movable unit;
- before the second measurement step, the reference element is moved to a predefinable second position and/or a predefinable second orientation with respect to the movable unit; and
- the first position is different from the second position, and/or the first orientation is different from the second orientation.

7. The method according to claim 4, wherein:
- in the second measurement, the position of the movable unit is determined in the at least one degree of freedom using a first measuring unit of the second measuring device;
- in the fourth measurement, the position of the movable unit is determined in the at least one degree of freedom using a second measuring unit of the second measuring device; and
- relative to the first measuring unit, the second measuring unit is displaced transversely with respect to the direction along the at least one degree of freedom.

8. The method according to claim 4, further comprising, in a third measurement step:
- moving the movable unit according to a third predefinable scheme in the at least one degree of freedom; and
- determining a third position of the movable unit in the at least one degree of freedom via fifth and sixth measurements, the fifth measurement being performed via the first measuring device, the sixth measurement being performed via the second measuring device using the reference element,
- wherein the first calibration step comprises calibrating the first measuring device based on results of the first, second, third, fourth, fifth and sixth measurements.

9. The method according to claim 8, wherein the movable unit is moved in the third measurement step according to the same scheme as in the first and second measurement steps.

10. The method according to claim 8, wherein:
- in the first measurement step, the reference element has a first position and first orientation with respect to the movable unit;
- before the second measurement step, the reference element is moved to a predefinable second position with respect to the movable unit; and
- before the third measurement step, the reference element is moved to a predefinable third orientation with respect to the movable unit, and wherein:
- the first position and second positions are different from each other, and the first orientation and the third orientation are different from each other; or
- before the second measurement step, the reference element is moved to a predefinable second predefinable second orientation with respect to the movable unit; and, before the third measurement step, the reference element is moved to a predefinable third position with respect to the movable unit; the first and third positions are different from each other; and the first and second orientations are different from each other.

11. The method according to claim 8, wherein:
- in the first calibration step, at least the results of the second and fourth measurements are evaluated to eliminate a systematic error of the encoder system, wherein a result of the evaluation is stored in a reference dataset;
- after the first calibration step:
  - moving the movable unit according to a fourth predefinable scheme in the at least one degree of freedom; and
  - determining a fourth position of the movable unit via seventh and eighth measurements, the seventh measurement being performed via the first measuring device, and the eighth measurement being performed via the second measuring device using the reference; and
- in a second calibration step, calibrating the first measuring device using the reference dataset and results of the seventh and eighth measurements.

12. The method according to claim 1, wherein:
- the movable unit defines a first region, the position of the region being determined via the first measuring device in a normal operation of the optical device;
- at least in the second measurement, the second measuring device captures a measuring region of the reference element; and
- the measuring region is arranged at least close to the first region.

13. The method according to claim 1, wherein:
- the optical device defines a region in which the movable unit is moved in a normal operation of the optical device; and
- in the first measurement step, the movable unit is moved in the at least one degree of freedom at least over a large part of the region.

14. The method according to claim 1, wherein, during the second measurement, at least one reference mark of the reference element is captured by the second measuring device.

15. The method according to claim 1, wherein the method is used to calibrate:
a) a position measuring device of a mask table of a microlithography device;
b) a position measuring device of a substrate table of a microlithography device;
c) a position measuring device of a substrate table of a substrate inspection device; or
d) a position measuring device of a mask table of a mask inspection device.

16. An optical device, comprising:
a movable unit configured to be moved by a drive unit;
a control device; and
a position measuring device, comprising:
- a first measuring device; and
- a second measuring device,
wherein:
- the position measuring device is configured to determine, in a measurement step, a position of the movable unit moved by the drive unit according to a predefinable scheme in at least one degree of freedom;

the first measuring device is configured to determine, in a first measurement, a first variable which is representative of the position of the movable unit in the at least one degree of freedom and to provide the first variable to the control device;

the second measuring device comprises a reference element which is connected to the movable unit and is configured to determine, in a second measurement, using the reference element, a second variable which is representative of the position of the movable unit in the at least one degree of freedom and to provide the second variable to the control device;

the control device is configured to calibrate, in a calibration step, the first measuring device using the results of the first measurement and the second measurement;

the second measuring device comprises an encoder system;

the reference element comprises a reference grid of the encoder system; and the optical device is configured to be used in microlithography.

17. The device according to claim 16, wherein the encoder system comprises a two-dimensional encoder system with a two-dimensional reference grid, and/or the encoder system has a resolution below one nanometer.

18. The optical device according to claim 16, wherein the reference element has a low thermal coefficient of expansion, and/or a thermal stabilisation device is provided, which is configured to thermally stabilise the reference element.

19. The optical device according to claim 16, wherein:

the measurement step is a first measurement step;

the positioning device is configured, at least in a second measurement step, to determine a position of the movable unit, moved by the drive unit according to a predefinable scheme in the at least one degree of freedom;

the first measuring device is configured to determine in a third measurement a first variable which is representative of the position of the movable unit in the at least one degree of freedom and to pass it to the control device;

the second measuring device is configured to determine in a fourth measurement, using the reference element, a second variable which is representative of the position of the movable unit in the at least one degree of freedom and to pass it to the control device; and the control device is configured, in the calibration step, to calibrate the first measuring device using the results of the first measurement, the second measurement, the third and fourth measurements.

20. The device according to claim 16, wherein the position measuring device is:
a) a position measuring device of a mask table of a microlithography device;
b) a position measuring device of a substrate table of a microlithography device;
c) a position measuring device of a substrate table of a substrate inspection device; or
d) a position measuring device of a mask table of a mask inspection device.

* * * * *

UNITED STATES PATENT AND TRADEMARK OFFICE
CERTIFICATE OF CORRECTION

| | | |
|---|---|---|
| PATENT NO. | : 8,065,103 B2 | Page 1 of 1 |
| APPLICATION NO. | : 12/731564 | |
| DATED | : November 22, 2011 | |
| INVENTOR(S) | : Yim-Bun Patrick Kwan | |

It is certified that error appears in the above-identified patent and that said Letters Patent is hereby corrected as shown below:

Title page, Assignee, Item (73), delete "Ziess" and inset --Zeiss--.

Column 10, Line 26, delete "also".

Signed and Sealed this
Thirty-first Day of January, 2012

David J. Kappos
*Director of the United States Patent and Trademark Office*